United States Patent

Yu et al.

Patent Number: 5,871,886
Date of Patent: *Feb. 16, 1999

[54] SANDWICHED MIDDLE ANTIREFLECTION COATING (SMARC) PROCESS

[75] Inventors: Chen-Hua Yu; Syun-Ming Jang, both of Hsin-chu, Taiwan

[73] Assignee: Taiwan Semiconductor Manufacturing Company, Ltd., Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 764,288

[22] Filed: Dec. 12, 1996

[51] Int. Cl.$^6$ ........................................................ G03F 7/00
[52] U.S. Cl. ........................... 430/316; 530/318; 530/313
[58] Field of Search ..................... 430/313, 318, 430/316

[56] References Cited

U.S. PATENT DOCUMENTS

| | | | |
|---|---|---|---|
| 4,557,797 | 12/1985 | Fuller et al. | 156/643 |
| 4,820,611 | 4/1989 | Arnold, III et al. | 430/313 |
| 5,286,608 | 2/1994 | Koh | 430/313 |
| 5,308,742 | 5/1994 | Ta | 430/313 |
| 5,330,883 | 7/1994 | Garza | 430/513 |
| 5,441,616 | 8/1995 | Nanda et al. | 204/192.23 |
| 5,449,639 | 9/1995 | Wei et al. | 437/187 |
| 5,506,166 | 4/1996 | Sandhu et al. | 437/60 |
| 5,672,243 | 9/1997 | Hsia et al. | 430/313 |
| 5,688,365 | 11/1997 | Ogoshi | 156/661.11 |

Primary Examiner—Kathleen Duda
Attorney, Agent, or Firm—George O. Saile; Stephen B. Ackerman; Larry J. Prescott

[57] ABSTRACT

A method of patterning a layer of reflective material, such as a layer of conductor metal, using a layer of antireflection coating material sandwiched between two layers of photoresist. A first layer of photoresist is formed on an integrated circuit wafer and provides a planar surface for subsequent layers of material. A layer of antireflection coating material is formed on the layer of first photoresist and a layer of second photoresist is formed on the layer of antireflection coating material. The layer of second photoresist is selectively exposed and developed. The layer of antireflection coating material is patterned using dry etching and the patterned layer of second photoresist as a mask. The layer of first photoresist is then patterned using dry etching and the patterned layer of antireflection coating material as a mask. The layer of reflecting material is then patterned using dry etching and the patterned layer of first photoresist as a mask. The patterned layer of first photoresist is then removed.

20 Claims, 3 Drawing Sheets

5,871,886

SANDWICHED MIDDLE ANTIREFLECTION COATING (SMARC) PROCESS

BACKGROUND OF THE INVENTION (1) Field Of The Invention

This invention relates to the use of antireflection coating materials in the patterning of layers of reflective material and more particularly to the use of a layer of antireflection coating material sandwiched between two layers of photoresist.

(2) Description Of The Related Art

In the manufacture of semiconductor integrated circuits a layer of photoresist is frequently used to pattern metal layers. The photoresist is selectively exposed to form a mask from the photoresist layer. Reflections from the reflective metal layer can cause standing waves which deteriorate the accuracy of the pattern transferred to the layer of photoresist and consequently to the metal layer. Anti reflection coating materials are frequently used to avoid this problem.

U.S. Pat. No. 5,330,883 to Garza describes the use of an antireflection coating layer on top of the photoresist layer to define critical dimensions.

U.S. Pat. No. 5,449,639 to Wei et al. describes the use of an antireflection coating layer between the metal layer and the photoresist layer to avoid the problem of reflections.

U.S. Pat. No. 5,286,608 to Koh describes the use of titanium oxide as an antireflection coating layer between the metal layer and the photoresist layer to avoid the problem of reflections.

U.S. Pat. No. 5,308,742 to Ta describes the use of an organic polymer beneath the photoresist as an antireflection coating material.

The present invention describes the use of a layer of antireflection coating material between two layers of photoresist to control reflections and provide a planar surface on which to expose the pattern to be transferred. The bottom photoresist layer planarizes the surface of the wafer. The antireflection coating layer avoids the problem of reflections when the top photoresist layer, formed over the layer of antireflection coating material, is selectively exposed.

SUMMARY OF THE INVENTION

In the fabrication of semiconductor integrated circuits layers of metal or other reflective layers must be patterned using photolithographic methods. The layer of metal is coated with a layer of photoresist which is selectively exposed to transfer a pattern to the photoresist. Reflections from the layer of metal can cause standing waves to form which adversely affect the accuracy of the pattern formation. Antireflection coatings are often used to avoid the problems of reflections from the layer of metal. Such antireflection coatings have been used both on top, top antireflection coatings, of the layer of photoresist and below, bottom antireflection coatings, the layer of photoresist.

Variations in the topography of integrated circuit wafers caused by various process steps, such as the formation of field oxide isolation regions, compound the problems of photolithographic processing. The effectiveness of both the top antireflection coatings and the bottom antireflection coatings is limited by these variations in topography.

It is a principle objective of this invention to provide a method using an antireflection coating for patterning a layer of reflective material which eliminates the problems due to variations in topography.

It is a further objective of this invention to provide a method of using an antireflection coating for patterning a layer of reflective material used in a semiconductor integrated circuit which eliminates the problems due to variations in topography and is compatible with the manufacture of semiconductor integrated circuits.

These objectives are achieved by using a middle antireflection coating sandwiched between two layers of photoresist. A layer of first photoresist is formed over the layer of reflective material to be patterned. The layer of first photoresist provides a planar surface for subsequent layers. A layer of antireflection coating material is then formed on the layer of first photoresist. A layer of second photoresist is then formed on the layer of antireflection coating material. The layer of second photoresist is then selectively exposed using a patterned mask and developed. The planar surface provided by the layer of first photoresist and the layer of antireflection coating material provides a very accurate pattern transfer from the mask to the layer of second photoresist.

That part of antireflection coating layer not covered by the patterned layer of second photoresist is etched away. That part of the layer of first photoresist not covered by the patterned layer of antireflection coating material is then etched away, which also etches away the patterned layer of second photoresist. That part of the layer of reflective material not covered by the layer of first photoresist is then etched away, which also etches away the patterned layer of antireflection material. The patterned layer of first photoresist is then removed.

The antireflection coating material and the planar surface provided by the layer of first photoresist provide improved dimensional tolerance in the pattern transferred to the layer of reflective material, such as a layer of conductor material.

DESCRIPTION OF THE PREFERRED EMBODIMENTS

Figure 1:
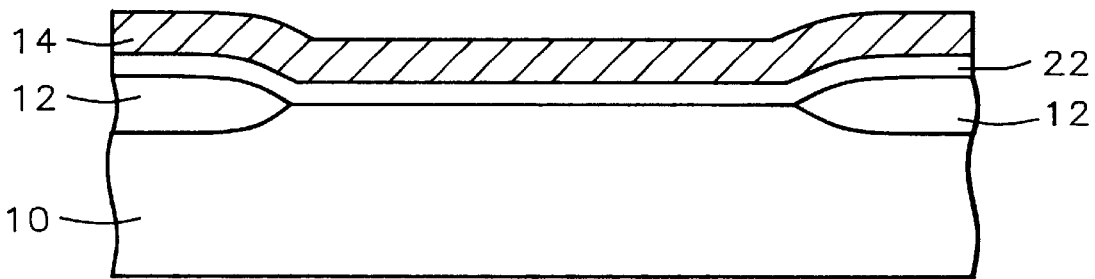
FIG. 1 shows a cross section view of an integrated circuit wafer showing field oxide isolation regions, a layer of gate oxide, and a reflective conductor layer.

Refer now to FIGS. 1–9, there is shown the preferred embodiment of the method of the present invention for forming a pattern in a layer of highly reflective material. FIG. 1 shows a cross section view of an integrated circuit wafer 10 having devices formed therein, not shown. The wafer 10 has field oxide isolation regions 12 formed therein and a layer of gate oxide 22 formed thereon. A layer of reflective material 14; such as polysilicon, polycide or a layer of conductive refractory metal on top of a layer of polysilicon, or other conductor; is formed on the layer of gate oxide 22. This embodiment describes the method of the present invention to form a gate electrode. Those skilled in the art will readily recognize that the method can be used to pattern any layer of reflective material. FIG. 1 shows that the topography of the wafer is not planar due largely to the field oxide isolation regions.

Figure 2:
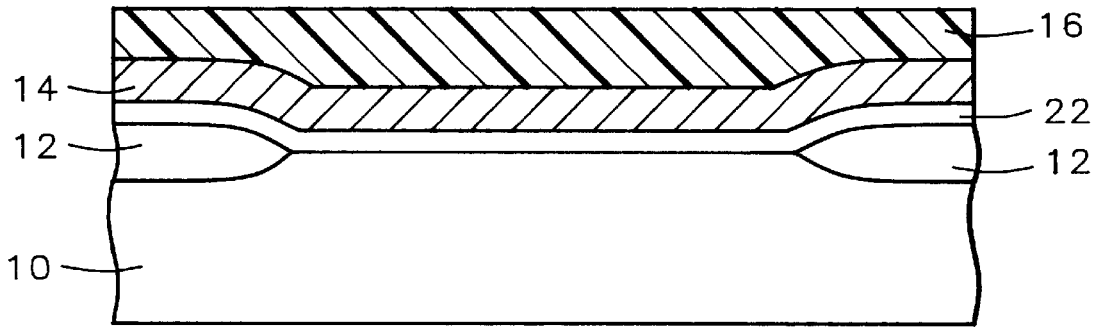
FIG. 2 shows a cross section view of the integrated circuit wafer showing a layer of first photoresist formed over the reflective conductor layer.
Figure 3:
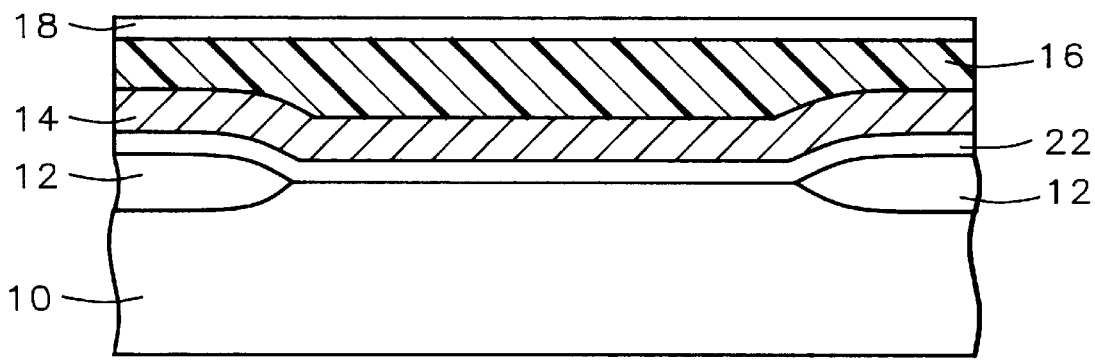
FIG. 3 shows a cross section view of the integrated circuit wafer showing a layer of antireflection material formed on the layer of first photoresist.
Figure 4:
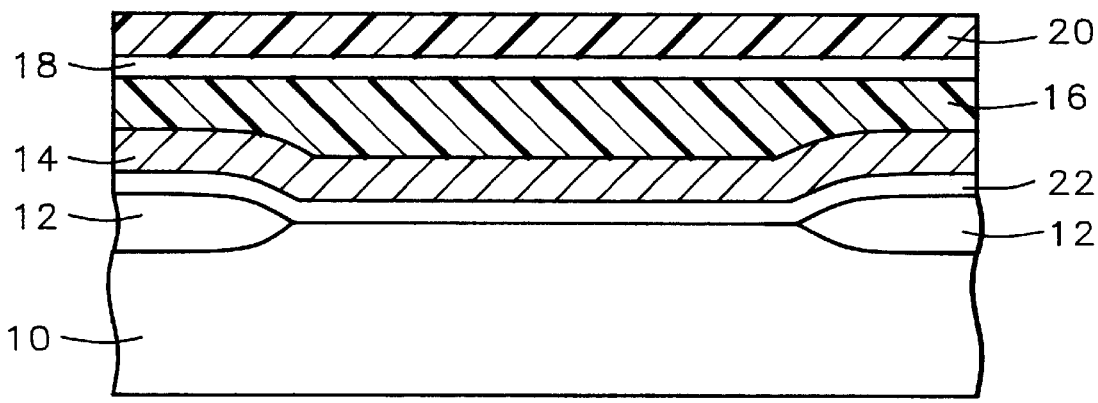
FIG. 4 shows a cross section view of the integrated circuit wafer showing a layer of second photoresist formed on the layer of antireflection material.

As shown in FIG. 2, a layer of first photoresist having a thickness of between about 3000 and 5000 Angstroms is formed on the wafer over the layer of reflective material 14. The layer of first photoresist provides a planar surface for subsequent layers of material. Next, as shown in FIG. 3, a layer of antireflection material 18 such as amorphus silicon or titanium nitride is formed on the layer of first photoresist. The layer of antireflection material 18 has a thickness of between about 300 and 2500 Angstroms and is deposited at a temperature of between about 20° C. and 150° C., such as amorphus silicon deposited by sputtering. Next, as shown in FIG. 4, a layer of second photoresist 20 having a thickness of between about 500 and 5000 Angstroms is formed over the layer of antireflection coating material 18.

Figure 5:
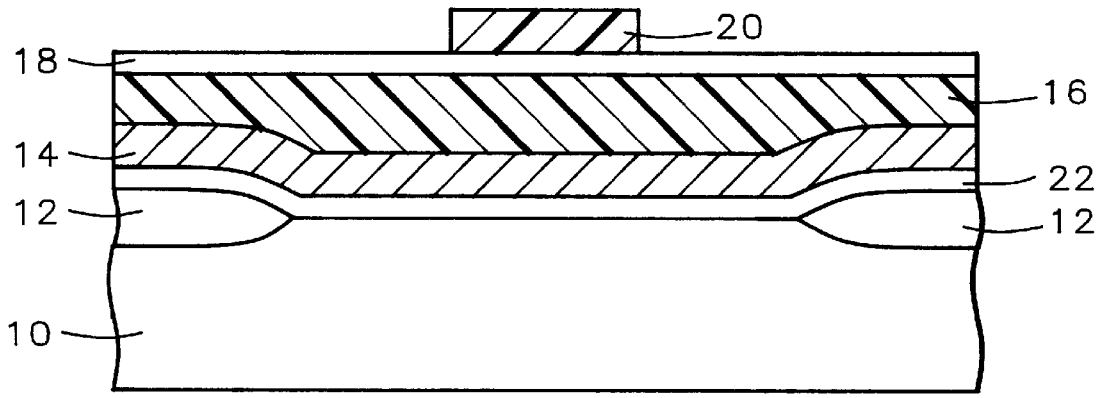
FIG. 5 shows a cross section view of the integrated circuit wafer showing the patterned layer of second photoresist.
Figure 6:
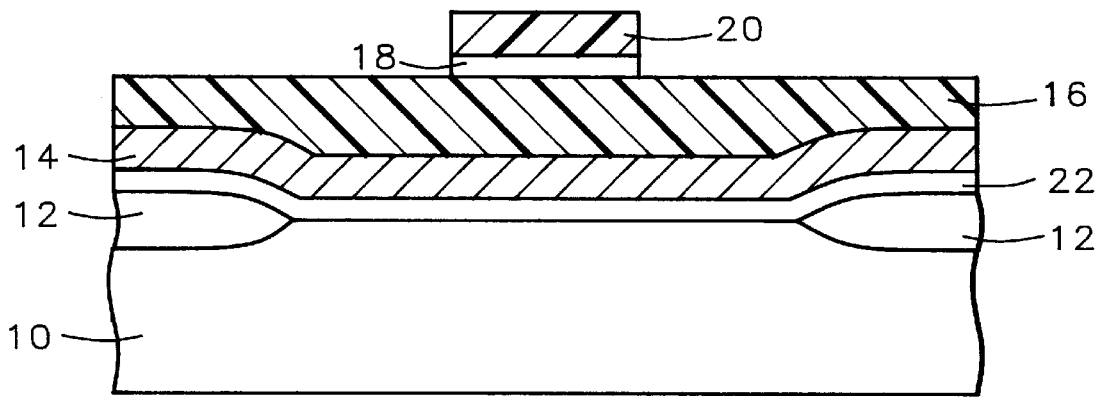
FIG. 6 shows a cross section view of the integrated circuit wafer showing the pattern layer of antireflection material and the patterned layer of second photoresist.

Next the layer of second photoresist 20 is selectively exposed using a mask having a pattern to be transferred to the layer of reflective polysilicon material 14 and developed. The quality of the pattern exposed in the layer of second photoresist 20 is significantly enhanced by the planar surface provided by the layer of first photoresist 16 and the prevention of standing waves by the layer of antireflection coating material 18. FIG. 5 shows the patterned layer of second photoresist 20. Next, as shown in FIG. 6, that part of the layer of antireflection coating material 18 not covered by the layer of second photoresist 20 is etched away using $Cl_2$+$HBr$+$O_2$ plasma etching and the patterned layer of second photoresist as a mask.

Figure 7:
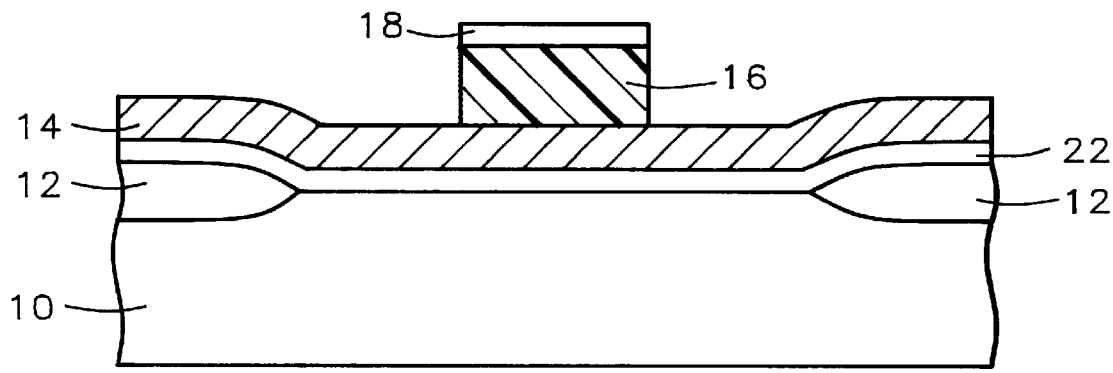
FIG. 7 shows a cross section view of the integrated circuit wafer showing the patterned layer of first photoresist and the patterned layer of antireflection material after the patterned layer of second photoresist has been removed.

Next, as shown in FIG. 7 that part of the layer of first photoresist 16 not covered by the patterned layer of antireflection material 18 is etched away using $O_2$+$He$ plasma etching and the patterned layer of antireflection coating material 18 as a mask. The patterned layer of second photoresist will also be etched away as the layer of first photoresist 16 is patterned, but the patterned layer of second photoresist is no longer required in the process.

Figure 8:
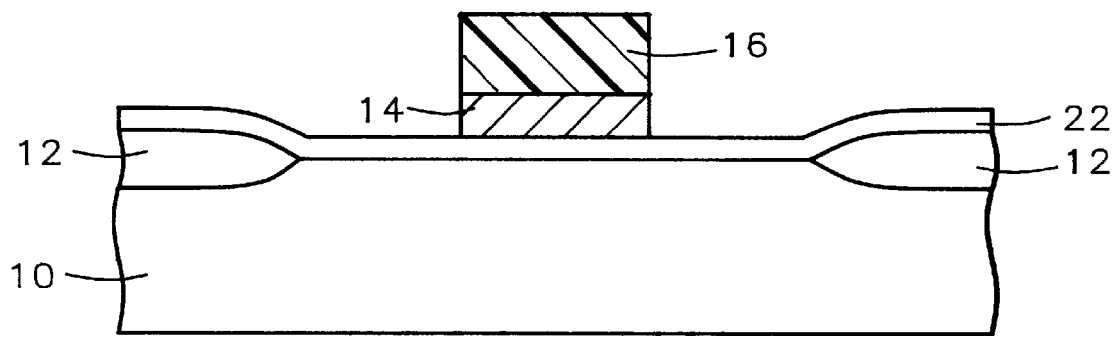
FIG. 8 shows a cross section view of the integrated circuit wafer showing the patterned layer of reflective conductor material and the patterned layer of first photoresist after the patterned layer of antireflection material has been removed.

Next, as shown in FIG. 8, that part of the layer of reflective material 14 is etched away using $Cl_2$+$HBr$+$O_2$ plasma etching and the patterned layer of first photoresist 16 as a mask. In this example the reflective material 18 is polysilicon or polycide, conductive refractory metal formed on top of polysilicon, and is to form the gate electrode of a device. The patterned layer of antireflection material will also be removed when the layer of reflective material 14 is patterned.

Figure 9:
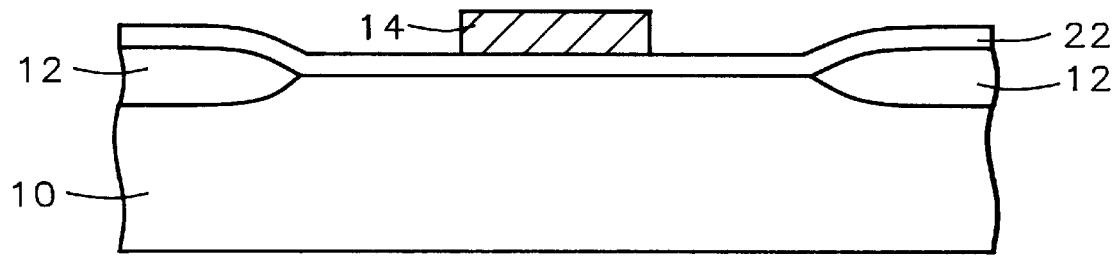
FIG. 9 shows a cross section view of the integrated circuit wafer showing the patterned layer of reflective conductor material after the patterned layer of first potoresist has been removed.

Next, as shown in FIG. 9, the patterned layer of first photoresist is removed and the patterning of the layer of reflective material 18 is complete. The layer of first photoresist provides a planar surface. The layer of antireflection material provides improved accuracy in the patterning of the layer of second photoresist. The patterning of the layer of second photoresist is the only step where reflections are a problem since all other patterning steps are accomplished using etching.

While the invention has been particularly shown and described with reference to the preferred embodiments thereof, it will be understood by those skilled in the art that various changes in form and details may be made without departing from the spirit and scope of the invention.

What is claimed is:

1. A method of patterning a layer of reflective material of an integrated circuit, comprising the steps of:
   providing a layer of reflective material on an integrated circuit wafer;
   forming a layer of first photoresist over said layer of reflective material;
   forming a layer of antireflection coating material over said layer of first photoresist;
   forming a layer of second photoresist over said layer of antireflection coating material;
   selectively exposing said layer of second photoresist through a mask having a pattern;
   developing said exposed layer of second photoresist, thereby forming said pattern in said layer of second photoresist;
   patterning said layer of antireflection coating material by means of etching away that part of said layer of antireflection coating material not covered by said selectively exposed and developed layer of second photoresist using said selectively exposed and developed layer of second photoresist as a mask;
   patterning said layer of first photoresist by means of etching away that part of said layer of first photoresist not covered by said patterned layer of antireflection coating material using said patterned layer of antireflection material as a mask thereby etching away said selectively exposed and developed layer of second photoresist whereby all of said second photoresist is removed;
   patterning said layer of reflective material by means of etching away that part of said layer of reflective material not covered by said patterned layer of first photoresist using said patterned layer of first photoresist as a mask thereby etching away said patterned layer of antireflection coating material whereby all of said antireflection coating material is removed; and
   removing said patterned layer of first photoresist.

2. The method of claim 1 wherein said layer of reflective material is a layer of polysilicon.

3. The method of claim 1 wherein said layer of reflective material is a layer of refractory metal formed over a layer of polysilicon.

4. The method of claim 1 wherein said layer of antireflection coating material is a layer of amorphous silicon deposited at a temperature of between about 20° C. and 150° C.

5. The method of claim 1 wherein said layer of antireflection coating material is a layer of titanium nitride deposited at a temperature of between about 20° C. and 150° C.

6. The method of claim 1 wherein said layer of first photoresist has a thickness of between about 3000 and 8000 Angstroms.

7. The method of claim 1 wherein said layer of second photoresist has a thickness of between about 500 and 5000 Angstroms.

8. The method of claim 1 wherein said layer of antireflection coating material has a thickness of between about 300 and 2500 Angstroms.

9. The method of claim 1 wherein said etching away that part of said layer of antireflection coating material not covered by said selectively exposed and developed layer of second photoresist using said selectively exposed and developed layer of second photoresist as a mask is accomplished using dry etching methods.

10. The method of claim 1 wherein said etching away that part of said layer of first photoresist not covered by said patterned layer of antireflection coating material using said patterned layer of antireflection material as a mask is accomplished using dry etching methods.

11. A method of fabricating an integrated circuit wafer, comprising the steps of:

providing an integrated circuit wafer;

forming devices and isolation regions in said integrated circuit wafer;

forming a layer of reflective material on said integrated circuit wafer;

forming a layer of first photoresist over said layer of reflective material;

forming a layer of antireflection coating material over said layer of first photoresist;

forming a layer of second photoresist over said layer of antireflection coating material;

selectively exposing said layer of second photoresist through a mask having a pattern;

developing said exposed layer of second photoresist, thereby forming said pattern in said layer of second photoresist;

patterning said layer of antireflection coating material by means of etching away that part of said layer of antireflection coating material not covered by said selectively exposed and developed layer of second photoresist using said selectively exposed and developed layer of second photoresist as a mask;

patterning said layer of first photoresist by means of etching away that part of said layer of first photoresist not covered by said patterned layer of antireflection coating material using said patterned layer of antireflection material as a mask thereby etching away said selectively exposed and developed layer of second photoresist whereby all of said second photoresist is removed;

patterning said layer of reflective material by means of etching away that part of said layer of reflective material not covered by said patterned layer of first photoresist using said patterned layer of first photoresist as a mask thereby etching away said patterned layer of antireflection coating material whereby all of said antireflection coating material is removed; and removing said patterned layer of first photoresist.

12. The method of claim 11 wherein said layer of reflective material is a layer of polysilicon.

13. The method of claim 11 wherein said layer of reflective material is a layer of refractory metal formed over a layer of polysilicon.

14. The method of claim 11 wherein said layer of antireflection coating material is a layer of amorphous silicon deposited at a temperature of between about 20° C. and 150° C.

15. The method of claim 11 wherein said layer of antireflection coating material is a layer of titanium nitride deposited at a temperature of between about 20° C. and 150° C.

16. The method of claim 11 wherein said layer of first photoresist has a thickness of between about 3000 and 8000 Angstroms.

17. The method of claim 11 wherein said layer of second photoresist has a thickness of between about 500 and 5000 Angstroms.

18. The method of claim 11 wherein said layer of antireflection coating material has a thickness of between about 300 and 2500 Angstroms.

19. The method of claim 11 wherein said etching away that part of said layer of antireflection coating material not covered by said selectively exposed and developed layer of second photoresist using said selectively exposed and developed layer of second photoresist as a mask is accomplished using dry etching methods.

20. The method of claim 11 wherein said etching away that part of said layer of first photoresist not covered by said patterned layer of antireflection coating material using said patterned layer of antireflection material as a mask is accomplished using dry etching methods.

* * * * *